United States Patent
Narayana et al.

[11] Patent Number: 6,055,177
[45] Date of Patent: Apr. 25, 2000

[54] MEMORY CELL

[75] Inventors: Pidugu L. Narayana, Santa Clara, Calif.; Daniel E. Cress, Starkville, Miss.; Andrew L. Hawkins, San Jose, Calif.; Derrick Savage, Starkville, Miss.

[73] Assignee: Cypress Semiconductor Corp., San Jose, Calif.

[21] Appl. No.: 09/105,724

[22] Filed: Jun. 26, 1998

[51] Int. Cl.[7] .................................................. G11C 11/00
[52] U.S. Cl. ........................ 365/154; 365/156; 365/190
[58] Field of Search ................................. 365/154, 190, 365/155, 156

[56] References Cited

U.S. PATENT DOCUMENTS

| | | | |
|---|---|---|---|
| 4,447,894 | 5/1984 | Imamura | 365/219 |
| 4,667,310 | 5/1987 | Takada | 365/154 |
| 5,216,636 | 6/1993 | Runaldue | 365/230.05 |
| 5,424,995 | 6/1995 | Miyazaki et al. | 365/154 |
| 5,742,557 | 4/1998 | Gibbins et al. | 365/154 |
| 5,765,214 | 6/1998 | Sywyk | 365/203 |
| 5,793,669 | 8/1998 | Sheffield et al. | 365/154 |
| 5,802,003 | 9/1998 | Iadanza et al. | 365/230.03 |

*Primary Examiner*—David Nelms
*Assistant Examiner*—Anh Phung
*Attorney, Agent, or Firm*—Christopher P. Maiorana, P.C.

[57] ABSTRACT

A circuit that may be used as a memory cell that may be capable of a differential write and a single ended read. The circuit generally comprises a memory storage element having a write bitline, a complement write bitline and a read bitline. One or more first gates may be configured to pass data on the write bitline and the inverted write bitline during a write operation. The write operation may occur in response to a write control signal. A second gate may be configured to pass data on from the storage element to the read bitline in response to read control signal. As a result, the circuit may be written by both the write bitline and the complement write bitline and may be read by the read bitline.

19 Claims, 3 Drawing Sheets

6,055,177

MEMORY CELL

FIELD OF THE INVENTION

The present invention relates to memory cells generally and, more particularly, to a memory cell that may allow for a differential writing (e.g., writing from two ports) and a single ended read operation.

BACKGROUND OF THE INVENTION

Conventional approaches to implementing memory cells in a first-in first-out (FIFO) memory may include implementing a single sided dual port memory cell (SSDP) or a dual ended dual port memory cell (DEDP). A SSDP may only require both a write operation and a read operation to be implemented from a single port.

FIG. 1 illustrates a SSDP 10 comprising a write wordline (WWL), a write bitline (WBL), a transmission gate (or pass gate) I2, an inverter I0, an inverter I1, a transmission gate I4, a read bitline (RBLB), and a read wordline (RWL). The inverter I0 and the inverter I1 generally form a storage element 11. The inverter I0 is generally sized greater than the inverter I1 in order for a single-ended write operation to occur. Specifically, when writing to the SSDP 10, the inverter I0 generally overpowers the inverter I1 to the extent that the cell gets written to, or flipped. To achieve high speed reads and writes, the SSDP 10 may require precharging of the bitlines prior to a read. Additionally, the SSDP may not provide operation over a wide variety of supply voltages. For example, the transmission gate I2, which is generally implemented as a n-channel device, may not pass a logic high (or "1") over a variety of supply voltages. If the transmission gate I2 is sized such that it passes a "1" in a 5 V operation, it generally cannot pass a "1" in a 3.3 V operation. Similarly, process techniques may be developed such that the transmission gate I2 can adequately pass a logic high in a 3.3 V operation, but generally at the expense of not being able to operate at a 5 V operation.

A dual ended dual port memory cell (DEDP) 20 is shown in FIG. 2. The DEDP may comprise a transmission gate 12, a transmission gate 14, a transmission gate 16, a transmission gate 18, an inverter 20, and an inverter 22. The inverter 20 and the inverter 22 generally form a storage element 24. A left wordline (LWL) is generally presented to the transmission gate 12 and the transmission gate 14. A right wordline (RWL) is generally presented to the gate of the transmission gates 16 and 18. The inverter 20 and the inverter 22 are sized similarly such that they use a minimum chip real estate. A left bitline (LBL) is connected to the inverter through the transmission gate 12. A left bitline bar (LBLB) is connected to the inverter 20, through the transmission gate 14. The left bitline LBL and the left bitline bar LBLB provide a differential write from the left port to the storage element 24. Since a differential write is performed in the DEDP 20, one inverter is generally not required to overpower the other inverter, which was generally required in writing to the SSDP 10. A read is generally performed by the left bitline bar LBLB and/or the left bitline LBL.

Similarly, the right bitline (RBL), is presented to the inverters 20 and 22 through the pass gate 16 and a right bitline bar RBLB is generally presented to the inverters 20 and 22 through the pass gate 18. During a differential write, a true signal is generally presented on the right bitline RBL and a complement signal generally presented on the right bitline bar RBLB. Since a differential writing to the DEDP 20 generally occurs, the overall sizing of the inverters 20 and 22 may be reduced, which may allow operation over a wide variety of supply voltages. However, the DEDP 20 consumes more chip real estate area then the SSDP 10 due to the additional pass gates (e.g., pass gate 16 and 18). When the DEDP is duplicated a number of times, which is typical in very large capacity memories, the area efficiency in implementing the chip may be reduced. Additionally, in a FIFO memory, it is only necessary to read from one port, not two ports as is possible with the DEDP 20. Not only would the design of the DEDP 20 be less efficient than the implementation of SSDP 10 in a FIFO buffer, but it would also implement functions not necessary in a FIFO buffer.

In an implementation using a 0.5 $\mu$m technology, the inverter 20 may be implemented having a p-channel transistor with a 0.5 $\mu$m channel width and a 0.55 $\mu$m channel length and an n-channel transistor with a 1.8 $\mu$m channel width and a 0.5 $\mu$m channel length. The inverter 22 may have a similar channel size. If the pass gates 12, 14, 16 and 18 are implemented having a channel width of 0.5 $\mu$m and a channel length of 0.55 $\mu$m, the overall area consumed by the DEDP 20 may be approximately 7.7 $\mu$m by 4.7 $\mu$m, or 36.19 $\mu$m.

SUMMARY OF THE INVENTION

The present invention concerns a circuit that may be used as a memory cell that may be capable of a differential write and a single ended read. The circuit generally comprises a memory storage element having a write bitline, a complement write bitline and a read bitline. One or more first gates may be configured to pass data on the write bitline and the inverted write bitline during a write operation. The write operation may occur in response to a write control signal. A second gate may be configured to pass data on from the storage element to the read bitline in response to read control signal. As a result, the circuit may be written by both the write bitline and the complement write bitline and may be read by the read bitline.

The objects, features and advantages of the present invention include providing a memory cell that allows for a dual sided write in a single ended read that (i) may operate over a wide variety of voltages, (ii) may be implemented using a minimum amount of chip real estate, and (iii) may provide a cell for use in a FIFO buffer.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 3:
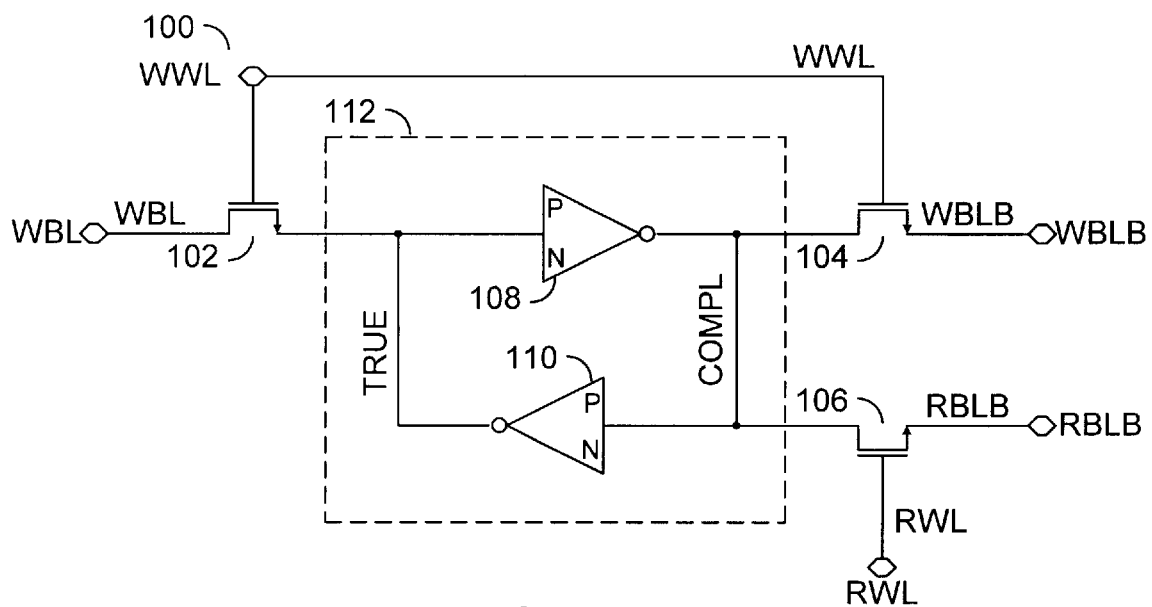
FIG. 3 is a circuit diagram of a preferred embodiment of the present invention.

Referring to FIG. 3, a circuit diagram of a cell 100 is shown in accordance with a preferred embodiment of the present invention. The cell 100 generally comprises a transmission gate 102, a transmission gate 104, a transmission gate 106, an inverter 108 and an inverter 110. The inverter 108 and the inverter 100 generally comprises a storage element 112. A write bitline (e.g., WBL) may be connected to the inverter 108 through the transmission gate 102. A write bitline bar (e.g., WBLB) may be connected to the inverter 108 through the transmission gate 104. A read bitline bar (e.g., RBLB may be connected to the storage element 112 through the transmission gate 106.

Figure 1:
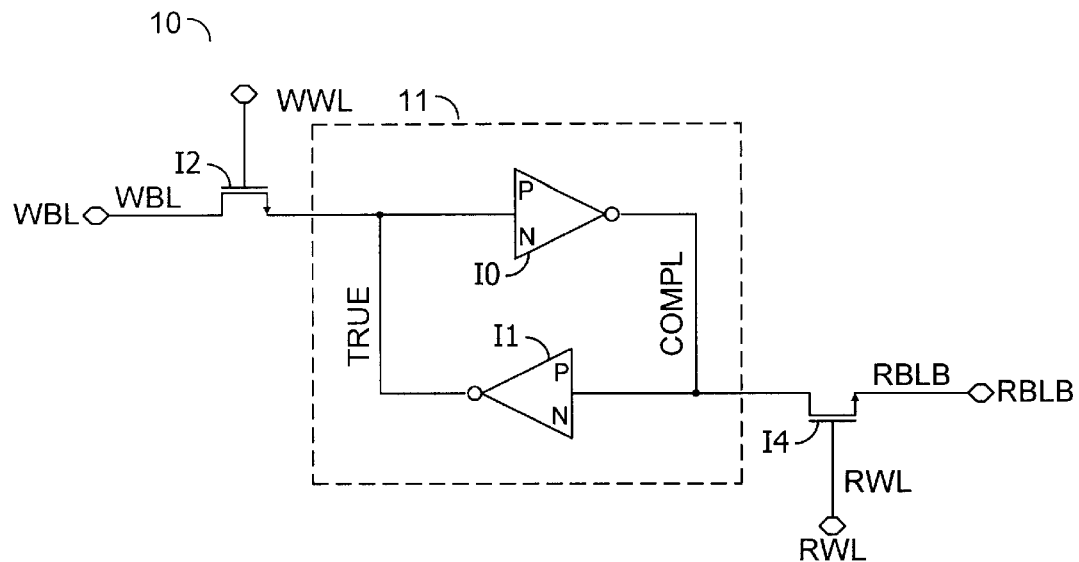
FIG. 1 is a circuit diagram of the conventional single-sided dual port memory cell.

During a write operation, data may be passed on the write bitline WBL in response to a write control signal presented to the control gate of the transmission gate 102. The control signal may be presented to the control gate of the transmission gate 102 by a write wordline (e.g., WWL). Similarly, data may be passed on a write bitline bar (e.g., WBLB) when a control signal is presented to the control gate of the transmission gate 104. In general, the write wordline WWL presents the same control signal to the control gates of the transmission gates 102 and 104. As a result, a differential write may occur by presenting data to the storage element 112 through two separate transmission gates (e.g., the transmission gates 102 and 104). In general, the data may be in a "true" state when received from the transmission gate 102 and may be in a complement state when received from the transmission gate 104. The transmission gates 102 and 104 generally provide for a differential write, which may minimize the size necessary to implement the inverters 108 and 110. Specifically, the inverters 108 and 110 may be equally sized since it is not generally required to have one inverter overpower the other inverter in a differential write implementation (as compared to a single ended write as described in FIG. 1).

Figure 2:
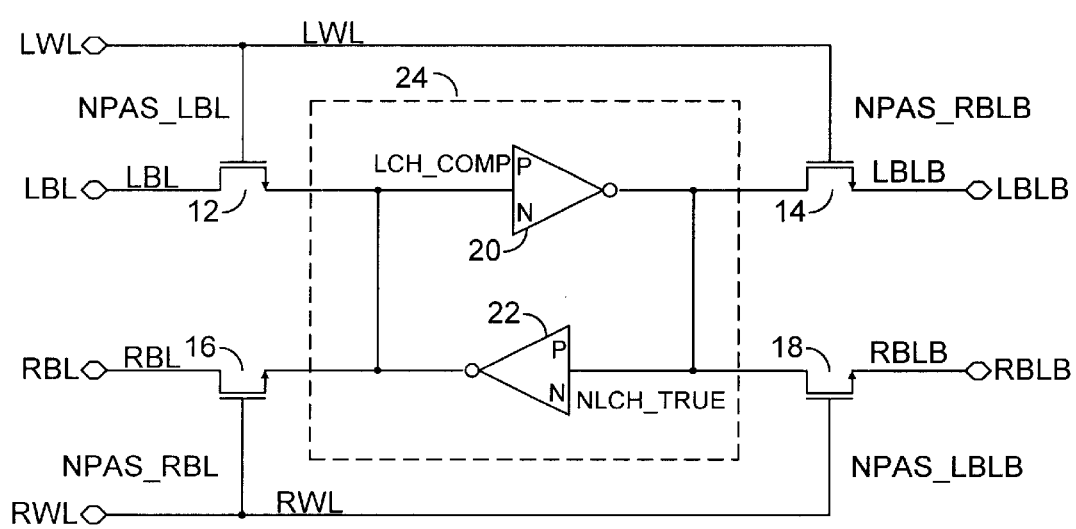
FIG. 2 is a circuit diagram of a conventional approach to a dual-ended dual port memory cell.

During a read operation, the transmission gate 106 generally connects the read bitline RBLB to the storage element 112 in response to a read control signal. The read control signal may be presented to the control gate of the transmission gate 106 by a read wordline (e.g., RWL). Since a single ended read is performed during a read operation, the additional overhead (i.e., the additional transmission gate in a differential read operation as shown in FIG. 2) is not generally required.

If the cell 100 is implemented using a 0.5 $\mu$m technology, the inverter 108 may be implemented, in one example, having a p-channel transistor with a channel width of 0.55 $\mu$m and a channel length of 0.55 $\mu$m and a n-channel transistor having a width of 0.8 $\mu$m and a length of 0.5 $\mu$m. The inverter 110 may have similar size and characteristics. The size and characteristics given for the inverter 108 and the inverter 110 are exemplary values used for comparison with a similar cell (i.e., the cell 20 of FIG. 2). Other values may be implemented as well as other size technologies. If the transmission gates 102, 104 and 106 are implemented having a 0.5 $\mu$m channel width and a 0.5 $\mu$m channel length, the overall size of the cell 100 would be approximately 5.4 $\mu$m×4.8 $\mu$m or 25.92 $\mu$m. This would equal an approximate 30% savings compared to the cell 20 shown in FIG. 2.

Figure 4:
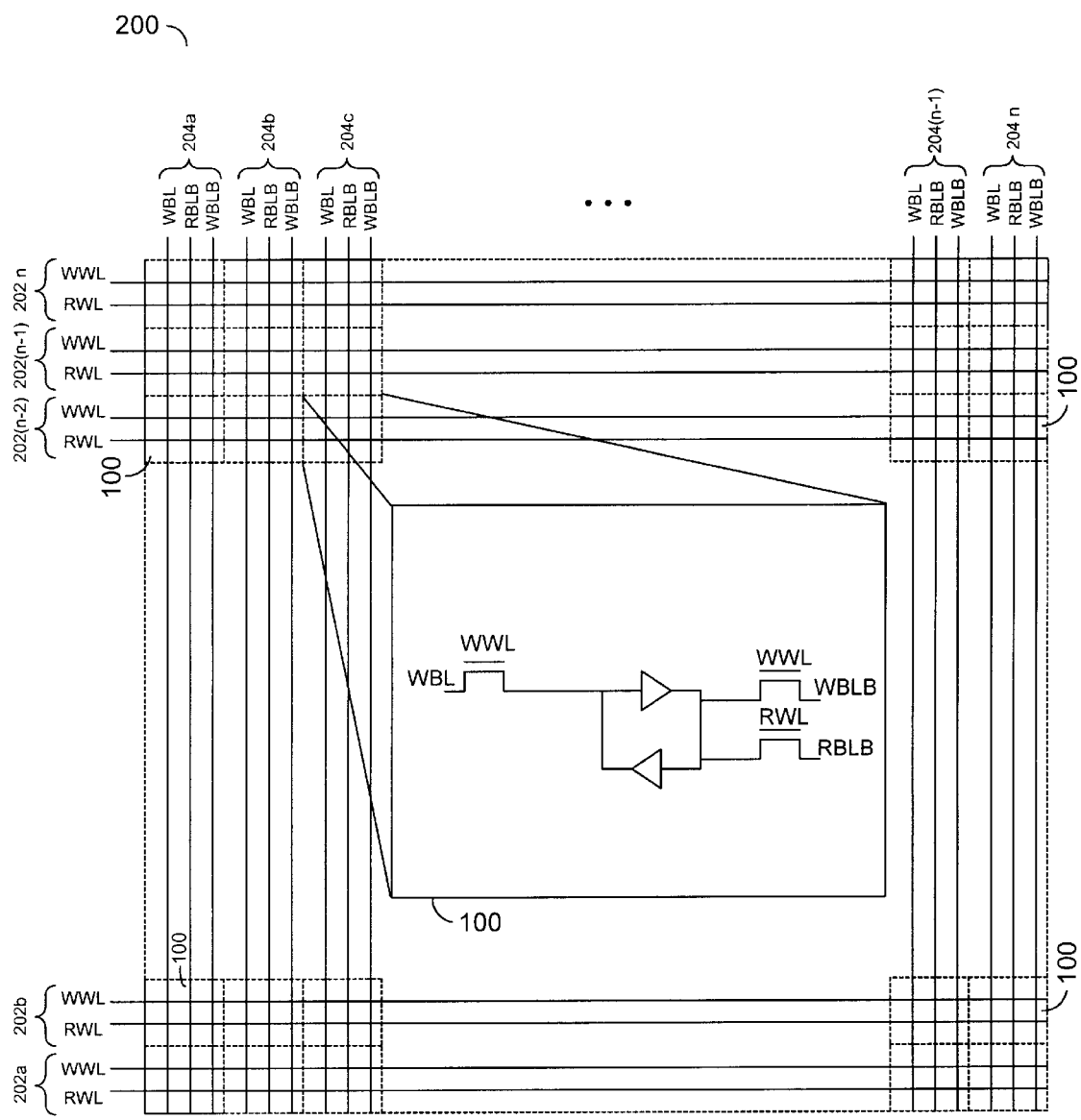
FIG. 4 is a block diagram illustrating the present invention implemented in a memory array.

Referring to FIG. 4 a block diagram of a circuit 200 is shown implementing the present invention. The circuit 200 is shown comprising a number of read wordline RWL and write wordline WWL pairs 202a–202n and a number of write bitline WBL, write bitline bar WBLB and read bitline bar groups 204a–204n. The circuit 100 is shown duplicated throughout the array 200.

While the invention has been particularly shown and described with reference to the preferred embodiments thereof, it will be understood by those skilled in the art that various changes in form and details may be made without departing from the spirit and scope of the invention.

We claim:

1. A circuit comprising:
   a memory storage element;
   a true write bitline and a complement write bitline configured to write data to said memory storage element; and
   a single ended read bitline configured to read data from said memory storage element.

2. The circuit according to claim 1, further comprising:
   one or more first gates configured to pass said data on said true write bitline and said complement write bitline in response to a write control signal.

3. The circuit according to claim 2, further comprising:
   a second gate configured to pass said data from said memory storage element to said single ended read bitline in response to a read control signal.

4. The circuit according to claim 3, wherein said one or more first gates comprise write pass gates and said second gate comprises a read pass gate.

5. The circuit according to claim 3, wherein said one or more first gates comprises write transmission gates and said second gate comprises a read transmission gate.

6. The circuit according to claim 2, further comprising a write wordline configured to provide said write control signal.

7. The circuit according to claim 3, further comprising a read wordline configured to provide said read control signal.

8. The circuit according to claim 1, wherein said memory storage element comprises a first inverter and a second inverter cross coupled with said first inverter.

9. The circuit according to claim 8, wherein each of said inverters has a size approximately equal to the size of each other.

10. The circuit according to claim 1, wherein said data on said single ended read bitline is a digital complement from the data on one of said true write bitline or said complement write bitline.

11. The circuit according to claim 1, further comprising an array comprising a plurality of said memory storage elements.

12. The circuit according to claim 1, wherein said circuit comprises a First-In First-Out memory.

13. A memory array comprising:
   a plurality of circuits according to claim 1.

14. The memory according to claim 13 comprising a First-In First-Out memory.

15. A circuit comprising:
   means for storing data;
   means for writing said data comprising a true write bitline and a complement write bitline;
   means for reading said data comprising a single ended read bitline;
   means for passing said data on said true and complement write bitlines in response to a write control signal; and
   means for passing said data from said storing means onto said single ended read bitline in response to a read control signal.

16. A method for transferring data to and from a memory element, comprising the steps of:
   (A) transferring said data from a true write bitline and a complement write bitline to said memory element in response to a write control signal; and
   (B) transferring said data from said memory element to a single ended read bitline in response to a read control signal.

17. The method according to claim 16, wherein said memory element comprises a first inverter and a second inverter cross coupled with said first inverter.

18. The method according to claim 17, wherein each of said inverters has a size approximately equal to the size of each other.

19. The method according to claim 16, wherein said data transferred to said single ended read bitline is a digital complement of the data transferred from said true write bitline.

* * * * *